United States Patent [19]

Yuh

[11] Patent Number: 5,512,845
[45] Date of Patent: Apr. 30, 1996

[54] BOOTSTRAP CIRCUIT

[75] Inventor: Jong H. Yuh, Kyoungki, Rep. of Korea

[73] Assignee: Hyundai Electronics Industries Co. Ltd., Kyoungki, Rep. of Korea

[21] Appl. No.: 389,227

[22] Filed: Feb. 15, 1995

[30] Foreign Application Priority Data

Feb. 16, 1994 [KR] Rep. of Korea .................. 94-2691

[51] Int. Cl.$^6$ .................................................. H03K 19/01
[52] U.S. Cl. ............................ 326/88; 327/589; 326/119
[58] Field of Search ................. 326/88, 119; 327/589

[56] References Cited

U.S. PATENT DOCUMENTS

| | | | |
|---|---|---|---|
| 4,906,056 | 3/1990 | Taniguchi | 327/589 |
| 5,059,816 | 10/1991 | Kobatake | 326/88 |
| 5,184,035 | 2/1993 | Sugibayashi | 326/88 |
| 5,268,600 | 12/1993 | Yeu | 327/589 |
| 5,313,107 | 5/1994 | Itoh | 326/88 |
| 5,369,320 | 11/1994 | Satani | 326/88 |

OTHER PUBLICATIONS

Ser. No. 08/348,192 date Nov. 29, 1994, Oh.

*Primary Examiner*—Edward P. Westin
*Assistant Examiner*—Andrew Sanders
*Attorney, Agent, or Firm*—Gary M. Nath; Anthony D. Miller; Nath & Associates

[57] ABSTRACT

A bootstrap circuit comprising an inverter for inverting an input signal from an input node, a delay stage for delaying the input signal from the input node for a predetermined time period, a first capacitor connected between an output terminal of the inverter and a junction node, a first NMOS transistor for transferring the input signal delayed by the delay stage to the junction node, the first NMOS transistor having a drain connected to an output terminal of the delay stage, a source connected to the junction node and a gate connected to a supply voltage source, a second capacitor connected between an output node and a ground voltage source, and a second NMOS transistor for transferring the input signal inverted by the inverter to the second capacitor connected to the output node in response to a signal charged on the first capacitor. According to the present invention, the bootstrap circuit bootstraps the input signal to a high voltage level at a high speed.

7 Claims, 2 Drawing Sheets

BOOTSTRAP CIRCUIT

BACKGROUND OF THE INVENTION

1. Field of the Invention

The present invention relates in general to a bootstrap circuit for bootstrapping an input signal to a high voltage level, and more particularly to a bootstrap circuit which is capable of bootstrapping the input signal to the high voltage level at a high speed.

2. Description of the Prior Art

A conventional bootstrap circuit is adapted to bootstrap a voltage to be charged on a bootstrap capacitor, using a parasitic capacitance of an NMOS transistor. In the NMOS transistor, a source is charged to a voltage level Vdd-Vt when a high logic signal is applied to a drain under the condition that a supply voltage Vdd is applied to a gate, where Vt is a threshold voltage of the NMOS transistor. Namely, the source of the NMOS transistor cannot be charged to the supply voltage level Vdd. In order to make up for such a defect, the conventional bootstrap circuit utilizes the parasitic capacitance of the NMOS transistor. However, the conventional bootstrap circuit has a disadvantage in that it has a time delay in bootstrapping the gate of the NMOS transistor when a large load amount is present in the source of the NMOS transistor. Such a problem with the conventional bootstrap circuit will hereinafter be described in detail with reference to FIG. 1.

Referring to FIG. 1, there is shown a circuit diagram of the conventional bootstrap circuit. As shown in this drawing, the conventional bootstrap circuit comprises an inverter I1 for inverting an input signal from an input node IN, a capacitor $C_L$ connected to an output node B, and an NMOS transistor T1 for transferring the input signal inverted by the inverter I1 to the capacitor $C_L$ through the output node B to charge the capacitor $C_L$. The conventional bootstrap circuit further comprises a delay stage 11 for delaying the input signal from the input node IN for a predetermined time period, and an NMOS transistor T2 having a gate for inputting the supply voltage Vdd. The NMOS transistor T2 is driven by the supply voltage Vdd to transfer the input signal delayed by the delay stage 11 to a gate of the NMOS transistor T1 through a junction node A.

The operation of the conventional bootstrap circuit with the above-mentioned construction will hereinafter be described.

When the input signal from the input node IN is high in logic, a voltage Vdd-Vt appears on the junction node A. In response to the voltage Vdd-Vt on the junction node A, the NMOS transistor T2 is turned off, whereas the NMOS transistor T1 is turned on, thereby causing a voltage charged on the capacitor $C_L$ to be discharged to the inverter I1. As a result, a voltage on the output node B remains at its low state. Then, when the input signal from the input node IN is changed from high to low in logic, a high logic signal from the inverter I1 is charged on the capacitor $C_L$ connected to the output node B through the NMOS transistor T1. In this case, a voltage $(Vdd-Vt)+\Delta V$ appears on the junction node A as it is bootstrapped by a parasitic capacitor Cgs of the NMOS transistor T1. As a result, the voltage on the capacitor $C_L$ is charged to the supply voltage level Vdd with no loss of a voltage corresponding to the threshold voltage Vt of the NMOS transistor T1.

However, the parasitic capacitor Cgs of the NMOS transistor T1 has no capacitance sufficient to bootstrap sufficiently the voltage on the junction node A. Also, the bootstrap operation based on the parasitic capacitor Cgs of the NMOS transistor T1 is very slow because it is advanced as the voltage on the output node B rises. Further, a time constant RC becomes large because the load capacitor $C_L$ generally has a very large capacitance, resulting in much time being required in charging the lead capacitor $C_L$. In result, the same time delay is required in bootstrapping the voltage on the junction node A, resulting in a degradation in a data transfer speed.

SUMMARY OF THE INVENTION

Therefore, the present invention has been made in view of the above problem, and it is an object of the present invention to provide a bootstrap circuit which is capable of bootstrapping an input signal to a high voltage level at a high speed.

In accordance with the present invention, the above and other objects can be accomplished by a provision of a bootstrap circuit comprising an inverter for inverting an input signal from an input node; delay means for delaying the input signal from the input node for a predetermined time period; a first capacitor connected between an output terminal of the inverter and a junction node; a first NMOS transistor for transferring the input signal delayed by the delay means to the junction node, the first NMOS transistor having a drain connected to an output terminal of the delay means, a source connected to the junction node and a gate connected to a supply voltage source; a second capacitor connected between an output node and a ground voltage source; and a second NMOS transistor for transferring the input signal inverted by the inverter to the second capacitor connected to the output node in response to a signal charged on the first capacitor.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
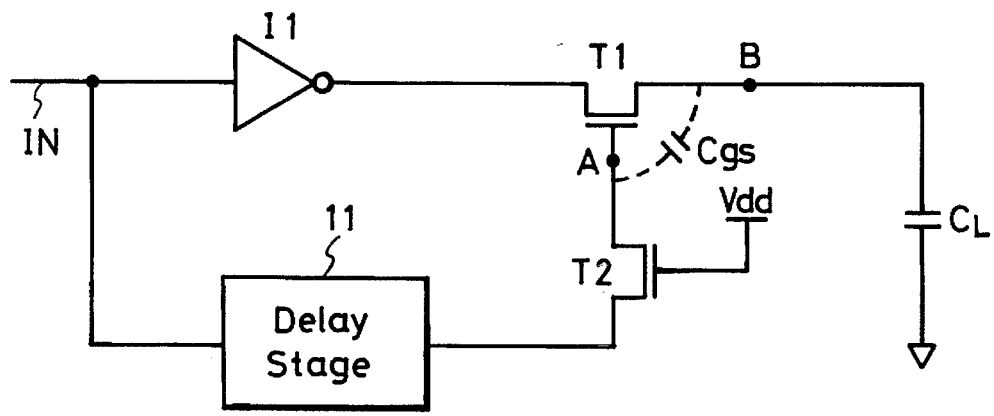
FIG. 1 is a circuit diagram of a conventional bootstrap circuit.
Figure 2:
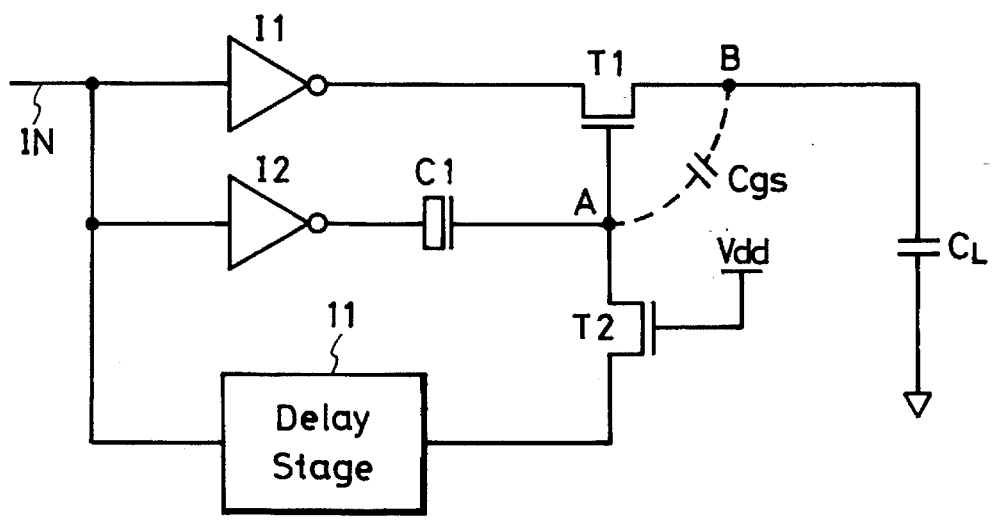
FIG. 2 is a circuit diagram of a bootstrap circuit in accordance with a first embodiment of the present invention.

Referring to FIG. 2, there is shown a circuit diagram of a bootstrap circuit in accordance with a first embodiment of the present invention. Some of parts in this drawing are the same as those in FIG. 1. Therefore, like reference numerals designate like parts.

As shown in FIG. 2, the bootstrap circuit comprises the inverter I1 for inverting the input signal from the input node IN, and the delay stage 11 for delaying the input signal from the input node IN for the predetermined time period. Also, the bootstrap circuit comprises an inverter I2 for inverting the input signal from the input node IN, and a capacitor C1 connected between an output terminal of the inverter I2 and the junction node A. The bootstrap circuit further comprises the NMOS transistor T2 for transferring the input signal delayed by the delay stage 11 to the junction node A. The NMOS transistor T2 has the gate connected to a supply voltage source Vdd, a drain connected to an output terminal of the delay stage 11 and a source connected to the junction node A. The bootstrap circuit further comprises the capacitor $C_L$ connected between the output node B and a ground voltage source, and the NMOS transistor T1 for transferring the input signal inverted by the inverter I1 and a signal charged on the capacitor C1 to the capacitor $C_L$ connected to the output node B.

The operation of the bootstrap circuit with the above-mentioned construction in accordance with the first embodiment of the present invention will hereinafter be described in detail.

At an initial state, when the input signal from the input node IN is high in logic, the junction node A is charged to the voltage level Vdd-Vt and the output node B remains at its grounded state by the NMOS transistor T1 and the inverter I1. With the gate connected to the supply voltage source Vdd, the NMOS transistor T2 is turned off at the moment that the junction node A is charged to the voltage level Vdd-Vt. As a result, the junction node A enters a floating state.

When the input signal from she input node IN is changed from high to low in logic, the voltage on the junction node A begins to be bootstrapped by the inverter I2 and the capacitor C1. The bootstrapped voltage on the junction node A causes the high logic signal from the inverter I1 to be charged on the load capacitor $C_L$ through the NMOS transistor T1. In this case, the junction node A remains at its floating state because the low input signal on the input node IN is delayed by the delay stage 11.

When the predetermined time period has elapsed, the supply voltage Vdd is charged on the load capacitor $C_L$ connected to the output node B and the low input signal is supplied to the drain of the NMOS transistor T2 through the delay stage 11. Then, the low input signal is transferred to the junction node A through the NMOS transistor T2, thereby causing a ground voltage to appear on the junction node A. The ground voltage on the junction node A is applied to the gate of the NMOS transistor T1, thereby causing the NMOS transistor T1 to be turned off. As a result, the bootstrap operation is ended. In the conventional bootstrap circuit, as stated previously, the bootstrap of the junction node A is performed by the parasitic capacitor Cgs between the gate and source of the NMOS transistor T1. For this reason, when the load capacitor $C_L$ is a large capacitance, a considerable time is required in charging the voltage on the output node B to the supply voltage level Vdd. As a result, the same time delay is required in bootstrapping the voltage on the junction node A. In accordance with the present invention, the bootstrap time of the junction node A can be adjusted by a logic threshold voltage of the inverter I2. Further, the bootstrapped voltage on the junction node A is the sum of the voltages charged on the capacitor C1 and the parasitic capacitor Cgs. Therefore, the voltage on the junction node A can be bootstrapped to a higher level. Moreover, the bootstrap operation based on the capacitor C1 is performed regardless of the voltage level on the output node B, resulting in a bootstrap speed being enhanced.

Figure 3:
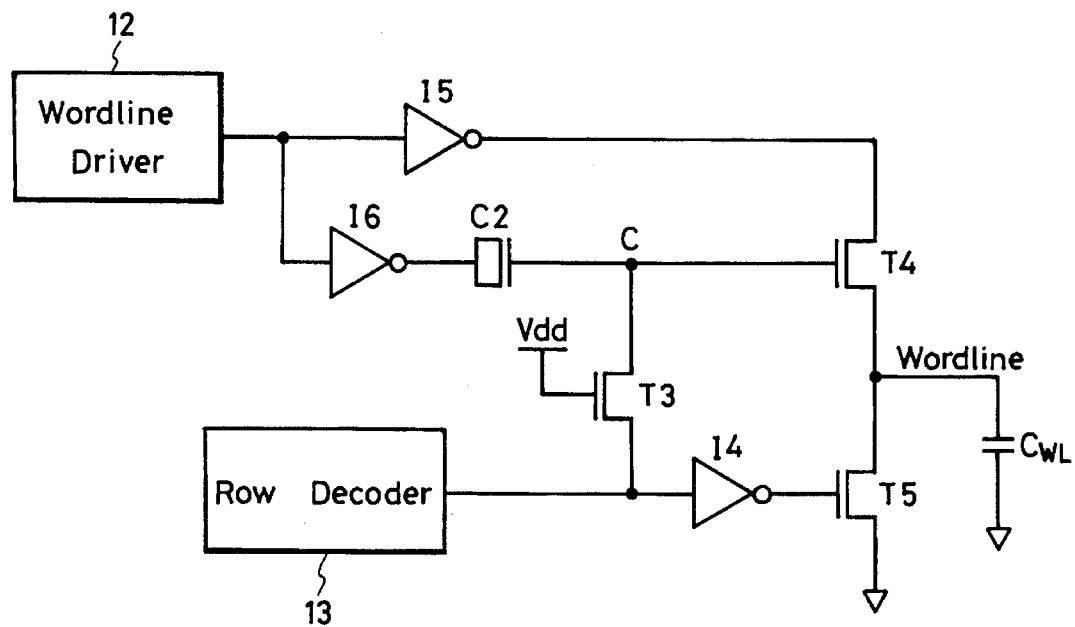
FIG. 3 is a circuit diagram of a bootstrap circuit in accordance with a second embodiment of the present invention, which is applied to a wordline enable circuit.

Referring to FIG. 3, there is shown a circuit diagram of a bootstrap circuit in accordance with a second embodiment of the present invention, which is applied to a wordline enable circuit. In the second embodiment of the present invention, the bootstrap circuit is adapted to bootstrap an output signal from a wordline driver 12 in response to an output signal from a row decoder 13 and transfer the bootstrapped signal to a wordline to enable it.

When the output signal from the row decoder 13 is changed from low to high in logic, an NMOS transistor T3 is turned off, thereby causing a capacitor C2 connected between a junction node C and an inverter I6 to be charged with a voltage Vdd-Vt. Then, when the output signal from the wordline driver 12 goes low in logic, the capacitor C2 bootstraps rapidly a voltage on the junction node C from the voltage level Vdd-Vt in response to a high logic signal from the inverter I6. As a result, in response to the bootstrapped voltage on the junction node C, an NMOS transistor T4 transfers the output signal from the wordline driver 12 inverted by an inverter I5 to the wordline. In this case, the signal supplied to the wordline has a voltage 2(Vdd-Vt) higher than that of the output signal from the wordline driver 12.

The operations of the two inverters I5 and I6, the two NMOS transistors T3 and T4 and the capacitor C2 are the same as those in FIG. 2 and details thereof will thus be omitted.

Figure 4:
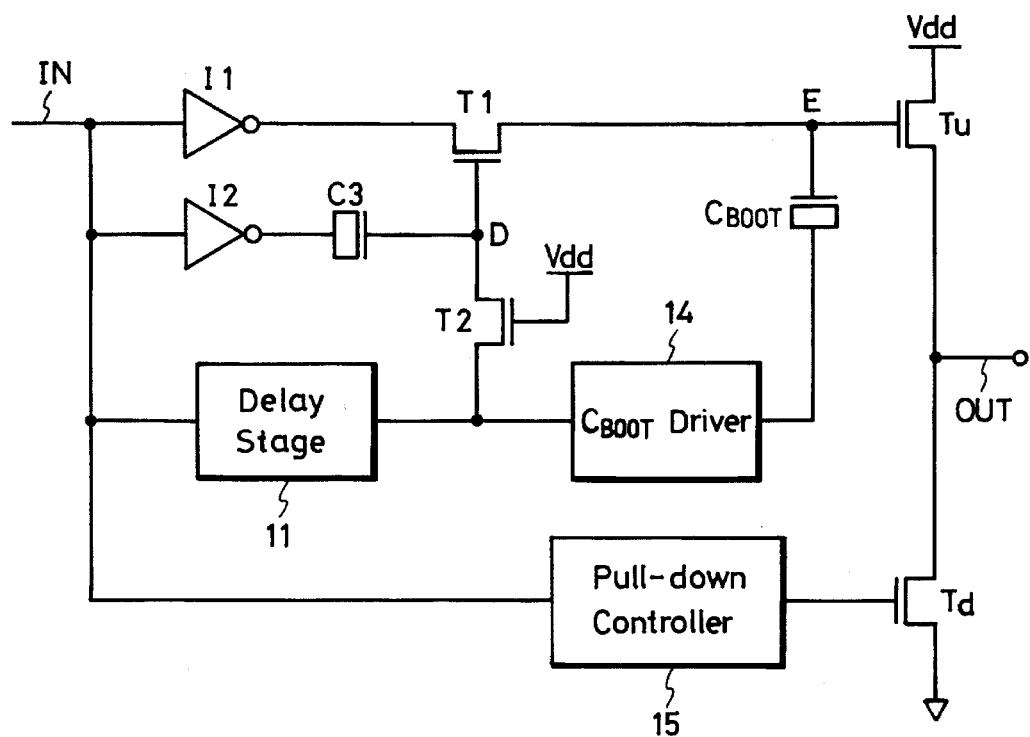
FIG. 4 is a circuit diagram of a bootstrap circuit in accordance with a third embodiment of the present invention, which is applied to a data output buffer.

Referring to FIG. 4, there is shown a circuit diagram of a bootstrap circuit in accordance with a third embodiment of the present invention, which is applied to a data output buffer. Some of parts in this drawing are the same as those in FIG. 2. Therefore, like reference numerals designate like parts. In the third embodiment of the present invention, the bootstrap circuit is adapted to bootstrap a data signal to a high voltage level at a high speed and transfer the bootstrapped data signal to a gate of a pull-up NMOS transistor Tu of the data output buffer connected to an output node E. To this end, the bootstrap circuit comprises a $C_{BOOT}$ driver 14 for bootstrapping a voltage charged on a capacitor $C_{BOOT}$.

The operation of the bootstrap circuit with the above-mentioned construction in accordance with the third embodiment of the present invention will hereinafter be described in detail.

At an initial state, when the data signal from the input node IN is high in logic, a junction node D is charged to the voltage level Vdd-Vt and the output node E remains at its grounded state by the NMOS transistor T1 and the inverter I1. With the gate connected to the supply voltage source Vdd, the NMOS transistor T2 is turned off at the moment that the junction node D is charged to the voltage level Vdd-Vt. As a result, the junction node D maintains the voltage level Vdd-Vt.

When the data signal from the input node IN is changed from high to low in logic, the voltage on the junction node D is bootstrapped to a voltage level 2Vdd-Vt by the inverter I2 and a capacitor C3. The bootstrapped voltage on the junction node D causes the high logic signal from the inverter I1 to be charged on the load capacitor $C_L$ through the NMOS transistor T1. In this case, the junction node D remains at its floating state because the low data signal on the input node IN is delayed by the delay stage 11.

When the predetermined time period has elapsed, the voltage 2(Vdd-Vt) is charged on the load capacitor $C_L$ connected to the output node E and the low data signal is supplied to the drain of the NMOS transistor T2 through the delay stage 11. Then, the low data signal is transferred to the junction node D through the NMOS transistor T2, thereby causing the ground voltage to appear on the junction node D. The ground voltage on the junction node D is applied to the gate of the NMOS transistor T1, thereby causing the NMOS transistor T1 to be turned off.

On the other hand, the $C_{BOOT}$ driver 14 inverts the low data signal delayed by the delay stage 11 and applies the resultant high logic signal to the capacitor $C_{BOOT}$ to bootstrap the voltage 2(Vdd-Vt) charged on the capacitor $C_{BOOT}$ to a voltage level 3Vdd-2Vt. Then, the bootstrapped voltage on the output node E is transferred to the gate of the pull-up NMOS transistor Tu of the data output buffer. As a result, the pull-up NMOS transistor Tu transfers the high data signal to an output line OUT. In this case, the high data signal transferred to the output line OUT has a voltage 3(Vdd-Vt).

As apparent from the above description, according to the present invention, the bootstrap circuit can bootstrap the input signal to the high voltage level at the high speed and transfer the bootstrapped signal to the output node. Further, the bootstrap circuit of the present invention can be applied to the wordline enable circuit and the data output buffer to enhance a wordline enable time and an operating speed of the data output buffer. Therefore, the bootstrap circuit of the present invention has the effect of enhancing an operating speed of a semiconductor memory device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A bootstrap circuit comprising:
    a first inverter for inverting an input signal from an input node;
    a second inverter for inverting the input signal from said input node;
    delay means for delaying the input signal from said input node for a predetermined time period;
    a first capacitor connected between an output terminal of said second inverter and a junction node;
    a first NMOS transistor for transferring the input signal delayed by said delay means to said junction node, said first NMOS transistor having a drain connected to an output terminal of said delay means, a source connected to said junction node and a gate connected to a supply voltage source;
    a second capacitor connected between an output node and a ground voltage source; and
    a second NMOS transistor for transferring the input signal inverted by said first inverter to said second capacitor connected to said output node in response to a signal charged on said first capacitor.

2. A bootstrap circuit as set forth in claim 1, wherein said bootstrap circuit is applied to a wordline enable circuit to supply a high voltage to a wordline.

3. A bootstrap circuit as set forth in claim 1, wherein said bootstrap circuit is applied to a data output buffer to supply a high voltage to a gate node of an NMOS pull-up driver of said data output buffer.

4. A bootstrap circuit as set forth in claim 1, further comprising a capacitor driver being serially coupled with said second capacitor between said output node and said delay means for inverting and supplying the input signal delaying by said delay means to boost an output voltage of said output node as high as that of said supply voltage.

5. A bootstrap circuit adapted to a wordline enable circuit having a wordline driver for driving a wordline and a row decoder for decoding a row address signal to control the wordline driver, the bootstrap circuit comprising:
    a first inverter for inverting an output signal of the wordline driver;
    a capacitor being coupled between an output terminal of the wordline driver and a node;
    a second inverter being coupled between the output terminal of the wordline driver and said capacitor to invert the output signal of the wordline driver;
    a voltage transfer means for transferring a voltage signal from the row decoder to said node;
    an NMOS pull-up driver for transferring the output signal of the wordline driver inverted by said first inverter to the wordline, in response with a voltage signal from said node;
    a third inverter for inverting the voltage signal from the row decoder; and
    an NMOS pull-down driver for transferring a ground voltage to the wordline in response with the voltage signal of the row decoder inverted by said third inverter.

6. A bootstrap circuit adapted to a data output buffer having an NMOS pull-up driver, a power supply voltage from a power supply source to an outlet line in response with a data signal from an inlet line, an NMOS pull-down driver for transferring a ground voltage to the outlet line and a pull-down controller being connected between the inlet line and the NMOS pull-down driver for complementally driving the NMOS pull-down driver for the NMOS pull-up driver in response with the data signal from the inlet line, the bootstrap circuit comprising:
    a first inverter being coupled between the inlet line and the NMOS pull-up driver for inverting the data signal from the inlet line;
    a second inverter for inverting the data signal from the inlet line;
    a first capacitor being coupled between an output terminal of said second inverter and a node;
    a delay means for delaying the data signal from the inlet line for a predetermined time period;
    a signal transfer means for the data signal delayed by said delay means to said node; and
    an NMOS transistor being coupled between an output terminal of said first inverter, the NMOS pull-up driver and said node for transferring the data signal inverted by said first inverter to the NMOS pull-up driver in response with a voltage signal on said node.

7. A bootstrap circuit as set forth in claim 6, further comprising:
    a load capacitor being connected to a junction node between said NMOS transistor and the NMOS pull-up driver; and
    a capacitor being coupled between said delay means and said load capacitor for inverting and supplying the data signal delayed by said delay means to said load capacitor to boost a voltage signal on said junction node as high as that of the power supply voltage.

* * * * *